United States Patent
Kimura et al.

(10) Patent No.: US 10,319,562 B2
(45) Date of Patent: Jun. 11, 2019

(54) CHARGED PARTICLE BEAM DEVICE

(71) Applicant: HITACHI, LTD., Chiyoda-ku, Tokyo (JP)

(72) Inventors: Megumi Kimura, Tokyo (JP); Momoyo Enyama, Tokyo (JP); Makoto Sakakibara, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 15/916,968

(22) Filed: Mar. 9, 2018

(65) Prior Publication Data
US 2018/0261426 A1    Sep. 13, 2018

(30) Foreign Application Priority Data

Mar. 13, 2017  (JP) ................... 2017-046974

(51) Int. Cl.
*H01J 37/28* (2006.01)
*H01J 37/147* (2006.01)

(52) U.S. Cl.
CPC .......... *H01J 37/28* (2013.01); *H01J 37/1474* (2013.01)

(58) Field of Classification Search
CPC .............................. H01J 37/28; H01J 37/1474
USPC ................................ 250/306, 307, 310, 311
See application file for complete search history.

(56) References Cited

FOREIGN PATENT DOCUMENTS

JP          2010-160080 A      7/2010

*Primary Examiner* — Nicole M Ippolito
*Assistant Examiner* — Hanway Chang
(74) *Attorney, Agent, or Firm* — Miles & Stockbridge P.C.

(57) ABSTRACT

To reduce the risk of measurement accuracy degradation and information lost due to adhesion of contamination that occurs by irradiation with charged particle beam.
The charged particle beam device includes: a deflector for scanning a charged particle beam; a detector for detecting secondary charged particles generated by the interaction of the charged particle beam with a sample; and a system control unit including a calculation part, a measurement part, and a storage part. The measurement part measures a feature amount from an image formed based on a signal output from the detector after a charged particle beam is scanned on the sample by the deflector (S303). The calculation part calculates an amount of contamination adhering to a surface of the sample by irradiation of the sample with the charged particle beam, from a change in the feature amount measured by the measurement part (S304). Then, the storage part adds the information of the contamination amount to the image and stores the image information (S313).

11 Claims, 13 Drawing Sheets

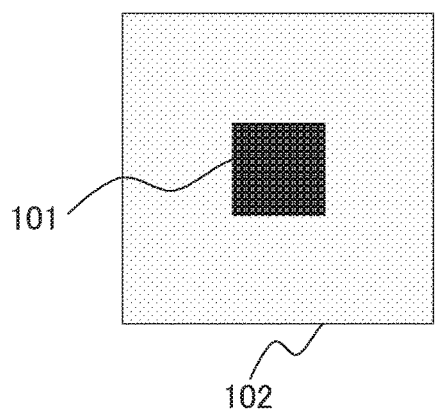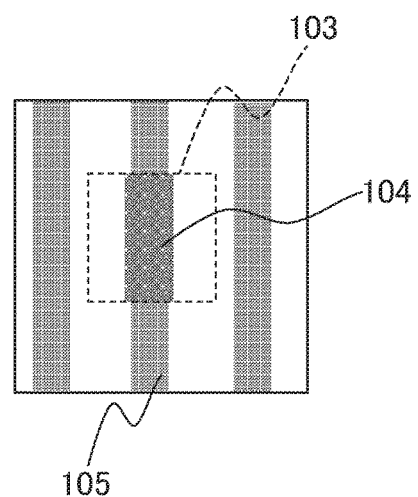

FIG. 5

```
OBSERVATION DATE AND TIME:
× ×/× ×/× × × ×:× ×:× ×
[OBSERVATION CONDITIONS]
·ACCELERATION VOLTAGE [V]:~~~~
·MAGNIFICATION:
·FOV:
    ·
    ·
    ·

[SAMPLE INFORMATION]
SAMPLES:Si
    ·
    ·
==CONTAMINATION AMOUNT==
AMOUNT OF SEDIMENT
○○[nm]
FEATURE AMOUNT
·BRIGHTNESS:····
  IMMEDIATELY AFTER START OF OBSERVATION
    ·
    ·
    ·
OTHERS
TOTAL IRRADIATION TIME
    ·
    ·
======================
```

1601

CHARGED PARTICLE BEAM DEVICE

CLAIM OF PRIORITY

The present application claims priority from Japanese patent application JP 2017-046974 filed on Mar. 13, 2017, the content of which is hereby incorporated by reference into this application.

TECHNICAL FIELD

The present invention relates to a charged particle beam device.

BACKGROUND ART

Charged particle beam devices for irradiating a sample with a charged particle beam, such as electron beam or ion beam, to obtain a signal of secondary charge particles, such as generated secondary electrons, are used for observation and local composition analysis of samples with fine structure or fine shape. Of the charged particle beam devices, a scanning electron microscope that uses an electron beam as a charged particle beam is applied to processes such as dimension measurement and defect inspection, due to its high resolution. Electron beam irradiation during observation by the scanning electron microscope causes mainly hydrocarbon-based contamination, which is present in the atmosphere of the sample chamber, to adhere to the sample. If contamination adheres to the sample, information that the sample originally has, namely, information such as sample composition information and sample shape changes, causing an error in the results in dimension measurement accuracy and composition analysis of fine structure such as semiconductor.

In order to avoid the influence of contamination, Patent Literature 1 describes a dimension measuring device and method for preventing the degradation of dimension measurement accuracy due to phenomena such as contamination associated with changes in potential on the sample surface due to electron beam irradiation, by estimating the potential change region due to the electron beam irradiation during observation based on the information of the observation sample stored in advance in a database, and by selecting the measurement region.

CITATION LIST

Patent Literature

Patent Literature 1: Japanese Unexamined Patent Application Publication No. 2010-160080

SUMMARY OF INVENTION

Technical Problem

When contamination adheres to the sample surface, the shape and composition information of the observation sample will change. In the case of the scanning electron microscope, when contamination adheres to the sample surface, the feature amount in the obtained image varies as compared to when contamination does not adhere. The feature amount is any one of image brightness, contrast, and sample shape pattern, or a combination of them. For example, FIG. 1A shows a flat sample in which contamination adheres when an observation region 101 is irradiated with electron beam. As a result, when an image of a region 102 that is wider than the observation region 101 is obtained, the amount of secondary electron particle signal obtained from the observation region 101 is different from the amount of secondary electron particle signal obtained from the peripheral region, so that the brightness of the image is uneven. However, there is no means for discriminating between the signal emitted from the sample and the signal emitted from the contamination, and it is difficult to determine whether the unevenness of the brightness of the obtained image is caused by the sample itself or caused by the contamination. FIG. 1B shows a sample with line and space pattern. In this case, when an observation region 103 is continued to be irradiated with electron beam, a line 104 included in the observation region 103 becomes thicker than a line 105 of the region, which not irradiated with electron beam, by an amount equal to the amount of adhering contamination. This is a problem because the dimensions of the target vary in the event that it is necessary to accurately estimate the dimensions of the line for process management and the like of semiconductor device.

In Patent Literature 1, it is difficult to determine how much change is included in the obtained image due to contamination and how much information is lost with this change, and thus loss of information due to contamination is unavoidable. It is necessary to manage the risk of measurement accuracy degradation and information loss due to contamination.

Solution to Problem

A charged particle beam device includes a deflector for scanning a charged particle beam, a detector for detecting secondary charged particles generated by the interaction of the charged particle beam with a sample, and a system control unit including a calculation part, a measurement part, and a storage part. The measurement part measures a feature amount from an image generated based on a signal output from the detector after a charged particle beam is scanned on the sample by the deflector. The calculation part calculates an amount of contamination adhering to a surface of the sample by the irradiation of the sample with the charged particle beam, from a change in the feature amount measured by the measurement part. The storage part adds the information of the amount of contamination into the image and stores the image information.

Advantageous Effects of Invention

The present invention reduces the risk of loss of information on the sample due to contamination caused by irradiation with charged particle beam.

BRIEF DESCRIPTION OF DRAWINGS

FIG. 1A is a diagram showing an example of change in the feature amount of an image due to contamination.

FIG. 1B is a diagram showing an example of change in the feature amount of an image due to contamination.

FIG. 5 is a diagram showing a text file in which the amount of contamination is described.

DESCRIPTION OF EMBODIMENTS

Figure 2:
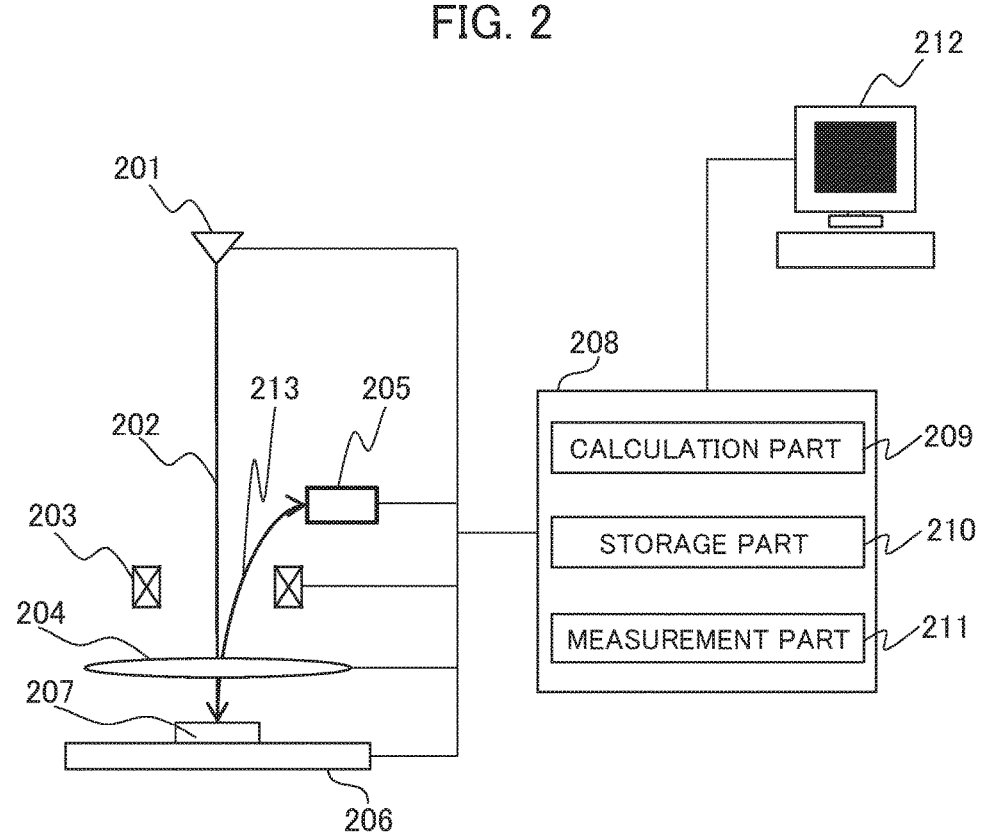
FIG. 2 is a diagram showing a main configuration of a scanning electron microscope.

Hereinafter, examples of the present invention will be described in detail with reference to the accompanying drawings. Note that like elements are indicated by like reference numerals throughout the drawings for describing the examples, and the repetitive description thereof will be omitted. Further, although particular examples are described of a sample observation and inspection device using electron beam as charged particle beam, the effect of the present invention is not lost in the case of using ion beam as charged particle beam or in the case of a measurement device or general electron microscope.

EXAMPLE 1

FIG. 2 is a diagram showing a main configuration of a scanning electron microscope which is a typical example of a charged particle beam device according to Example 1. First a description will be given of the device configuration. A scanning deflection deflector 203, an objective lens 204, and a detector 205 are provided in the downstream direction in which an electron beam 202 is derived from an electron source 201. The objective lens 204 is not limited to electromagnetic lens that controls the focus by an excitation current, but also includes electrostatic lens or a combination of electromagnetic lens and electrostatic lens. A stage 206 is configured to move with a sample 207 placed thereon. The electron source 201, the scanning deflection deflector 203, the objective lens 204, the detector 205, and the stage 206 are disposed within a vacuum vessel, while the system control unit 208 is connected to each of the components. The sample is carried in and out of vacuum by means of a carrying-out system not shown.

The system control unit 208 functionally includes a calculation part 209, a storage part 210, and a measurement part 211, and is connected to an input/output device 212. The system control unit 208 functions as the calculation part 209 and the measurement part 211 to execute programs, and the like, stored in the storage part 210. In this way, the system control unit 208 can calculate the amount of contamination, perform various types of image processing, or control the control device or the like. The input/output device 212 may be configured in such a way that input means such as a keyboard and a mouse, as well as display means such as a liquid crystal display device are provided separately as an input section and an output part, or may also be configured with integrated input/output means using a touch panel or other interface device.

Next, a description will be given of an observation performed by using the device of the present example. The detector detects a signal generated as a result of irradiation of an object region, which is set in advance in the sample by an operator, with an electron beam and scanning of the electron beam, to generate an image based on the amount of detected signal. The electron beam 202 emitted from the electron source 201 is controlled by the objective lens 204, and is focused on the sample 207 so that the beam diameter is the minimum. The scanning deflection deflector 203 is controlled by the system control unit 208 so that the electron beam 202 scans a predetermined region of the sample 207. The electron beam 202 reaching the surface of the sample 207 interacts with a substance near the surface. Because of this interaction, electrons such as reflection electrons, secondary electrons, and Auger electrons are generated from the sample and become a signal to be obtained. A secondary electron 213 generated from a position the electron beam 202 reaches on the sample 207 is detected by the detector 205. The signal processing of the secondary electron 213 detected by the detector 205 is performed in synchronization with a scanning signal that is transmitted from the system control unit 208 to the scanning deflection deflector 203. In this way, an SEM image is formed and then the observation of the sample 207 is performed. Note that, in this figure, the detector 205 is located in the upstream of the objective lens 204 and the scanning deflection deflector 203, but the present invention is not intended to be limited to the specific arrangement. Further, although not shown, an aligner for correcting the optical axis of the electron gun is provided between the electron source 201 and the objective lens 204, in order to correct the optical axis if the central axis of the electron beam deviates with respect to the aperture and the electron optical system.

Figure 3:
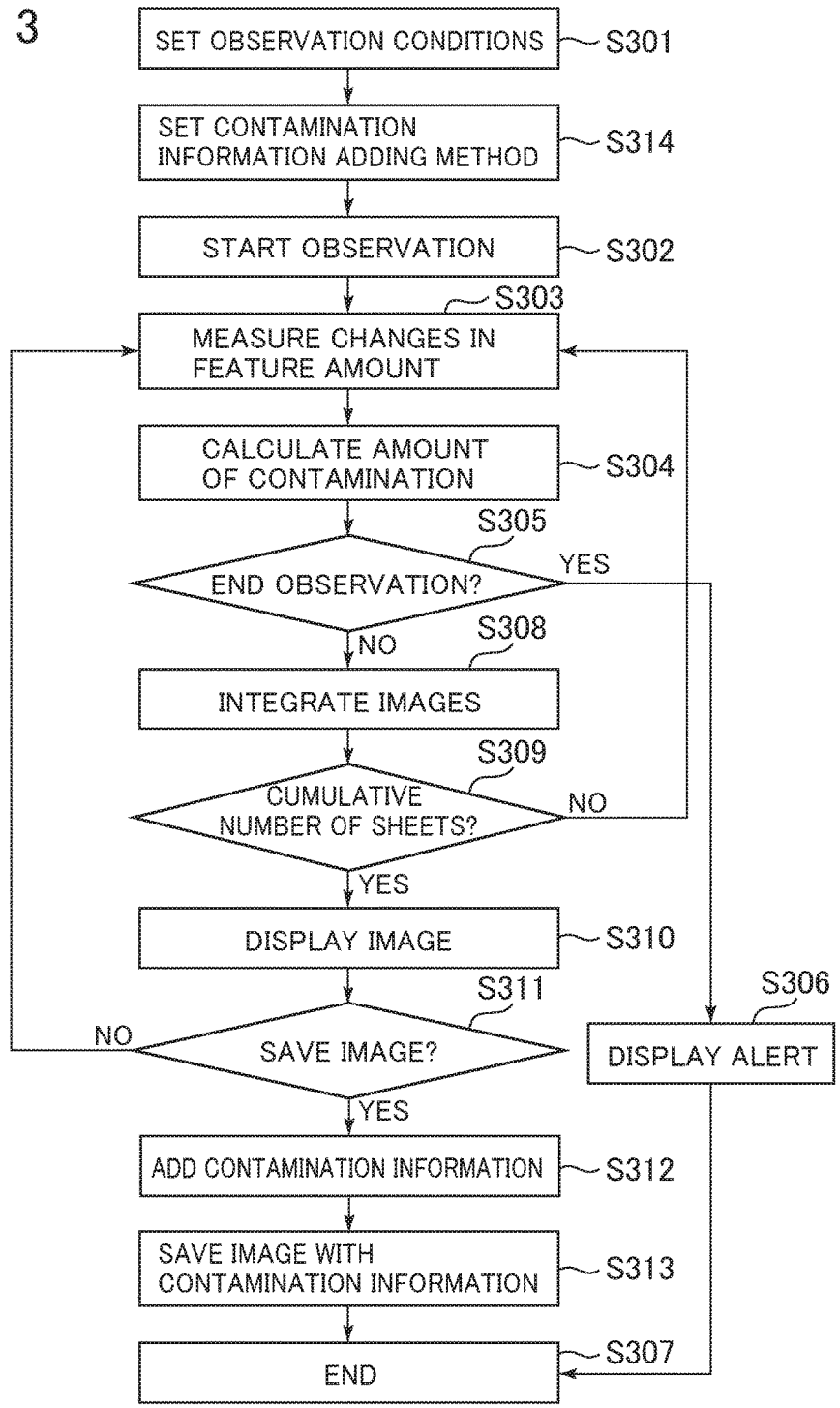
FIG. 3 is a flow chart for obtaining an image to which contamination information is added.
Figure 4:
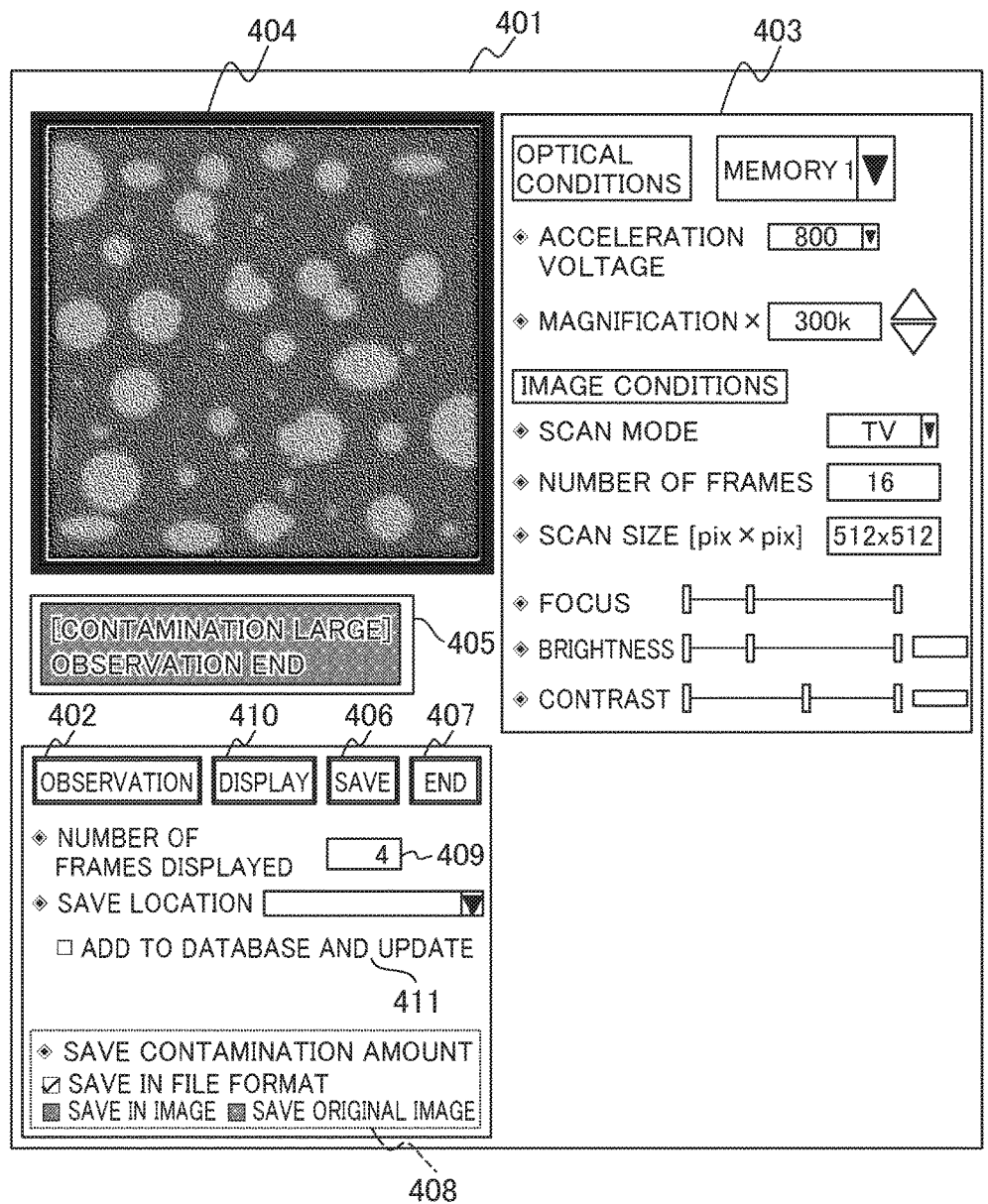
FIG. 4 is a diagram showing an operator control panel.

Here, as described above, the feature amount in the image varies when contamination adheres to the sample surface by electron beam irradiation during observation. This example reduces the risk of information loss due to contamination by measuring the change in the feature amount, managing the amount of contamination adhered to the sample surface being observed based on the measurement result, and adding the information to the image. This procedure will be described with reference to FIGS. 3 and 4. FIG. 3 is a flowchart of an observation until obtaining an image to which contamination information is added. FIG. 4 is an example of GUI in which the operator controls. Hereinafter, the amount of contamination adhered to the sample surface by electron beam irradiation during the observation is referred to as "contamination amount".

First, the operator sets observation conditions by controlling a control panel 401 (Step S301). The observation conditions include, for example, optical condition such as acceleration voltage and magnification setting, scan mode, number of frames, scan size, excitation current value of the objective lens for adjusting the focus, brightness, contrast, and the like. The setting of observation conditions can be set by direct input by the operator through an observation condition setting section 403 (see FIG. 4), or using a method of selecting from a pull-down menu or the like of an observation condition table prepared in advance. Next, the operator selects a desired method for adding contamination information to the image obtained by the observation from a contamination information adding method selection section 408 (Step S314). In this example, the operator selects an example of saving the image together with a text file ("save in file format").

When the operator starts observation by pressing an observation button 402 (Step S302), irradiation of the sample with an electron beam is started and an image is generated. The measurement part 211 (see FIG. 2) measures the change in the feature amount from the generated image (Step S303), and the calculation part 209 calculates the contamination amount per frame from the change in the feature amount (Step S304). Note that, like the image display described below, the measurement of the feature amount as well as the calculation of the contamination amount may be performed for each frame, or may be performed for each image after integration. When the calculation is performed for each frame, the generated image is temporarily stored in the storage part 210, and then the measurement of the feature amount as well as the calculation of the contamination amount are performed. Here, any one of image brightness, contrast, and sample shape pattern or a combination of them can be taken as the feature amount. When the contamination amount obtained by the calculation part 209 is equal to or more than a predetermined threshold value, the device determines to end the observation (Step S305). Then, the device displays an alert indicating that the contamination amount is equal to or more than the given value and the observation will be ended, and/or the contamination amount on an alert display section 405 of the control panel 401 (Step S306), and ends the observation (Step S307). At this time, the image generated by the observation may be associated with the contamination amount in the observation region and stored in the storage part 210. Note that the threshold value to determine the contamination amount in Step S305 may be set by inputting a specific value by the operator, or may be automatically set based on the program stored in advance in the storage part.

When the contamination amount is less than the threshold value, it is determined whether or not the number of times of image formation, namely, the number of integrated frames is reached. The operator sets an arbitrary value, as the number of integrated frames, through the input section 409 of the control panel 401 before the observation. It may also be possible that the number of integrated frames is automatically set to a value stored in advance in the storage part 210 according to the observation conditions. The image is integrated for each frame according to the set number of integrated frames (Step S308), and the steps following the "measurement of the change in the feature amount" are repeated until the number of integrated frames is reached (Step S309). When the set number of integrated frames is reached, the integrated image is displayed on an output window 404 (Step S310). The operator determines whether or not to save the image (Step S311). When saving the image, the operator presses a save button 406 of the control panel 401, adds the contamination amount being observed, as contamination information, into the image (Step S312). Then, the operator saves the image to which the contamination is added into the storage part 210 (Step S313). FIG. 5 is an example of the text file in which the contamination amount is described. In this way, the contamination information is obtained by combining the observation condition, the optical condition, and the like, in addition to the contamination amount of the generated image. The method of adding the contamination amount to the image is selected by setting the contamination information adding method selection section 408 of the control panel 401. In addition to method using the calculation part to associate the image with a test file 1601 in which the contamination amount is described and save in the storage part 210, it is also possible to set a method of describing the contamination amount on the image to be saved, or a method of saving only the original image without adding the contamination amount. The operator finally presses an observation end button 407 to end the operation (Step S307). When the image is not saved, the process returns to the measurement of the change in the feature amount (Step S303).

Figure 6:
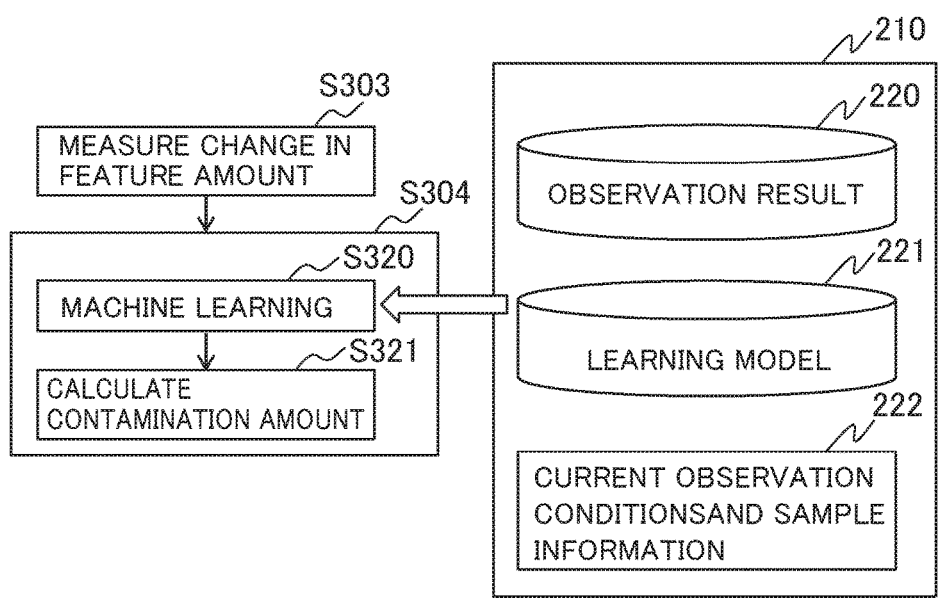
FIG. 6 is a diagram showing a step of calculating the amount of contamination.

Step S304 of calculating the contamination amount from the measured feature change amount will be described with reference to FIG. 6. An observation result database 220, a learning model database 221, and current observation conditions and sample information 222 are stored in the storage part 210. The observation result database 220 is a database that accumulates past observation results. The observation result database 220 stores the observation conditions (for example, parameters such as optical conditions (acceleration voltage, probe current, etc.) for the observation, degree of vacuum, and detector condition), the sample information (sample material, sample pattern shape, etc.), and the feature change amount as well as the contamination amount as the observation result. The contamination amount can be measured, for example, by using a scanning probe microscope. The learning model database 221 is a database for modeling and storing the relationship between the feature change amount and the contamination amount under given observation conditions and sample information. In this way, the device generates learning models as teacher data in advance from the observation results stored in the observation result database 220 by means of machine learning (Step S320). Then, the device calls a learning model corresponding to the current observation conditions and sample information 222, and calculates the contamination amount from the change in the feature amount obtained in the current observation (Step S321).

While the foregoing has described the observation flow for obtaining an image together with contamination information, various variations are possible. For example, the flow chart in FIG. 3 shows the example of displaying the alert and the contamination amount on the alert display section 405 before the end of the observation, but the display may be omitted. Further, the type of feature amount to be measured may be selected by the operator or automatically selected by the device. Further, the absolute value of the measured feature change amount can also be treated as contamination amount, instead of using the contamination amount itself.

EXAMPLE 2

In the present example, the electron beam irradiation during observation is performed by combining irradiation of observation region and irradiation of wide region including the observation region. The device configuration and observation procedure similar to those of Example 1 will not be described again here.

In the present example, irradiation of observation region with electron beam and irradiation of wide region including the observation region with electron beam are switched at a fixed ratio. The region that includes the observation region and is wider than the observation region is referred to as "wide region". Contamination moves from the outside of the region irradiated with the electron beam to the region irradiated with the electron beam, and then adheres. By irradiating the wide region with the electron beam, the range irradiated with the electron beam is extended to an area outside the observation region, so that the adhesion of contamination to the observation region is reduced.

Figure 7A:
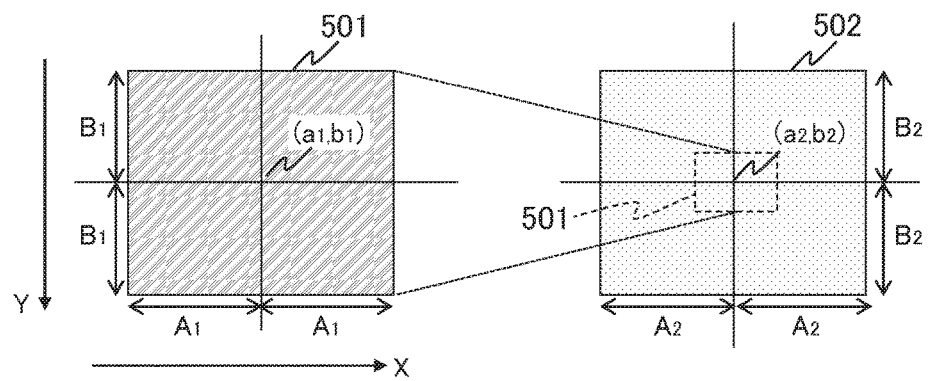
FIG. 7A is a diagram showing the relationship between an observation region and a wide region.
Figure 7B:
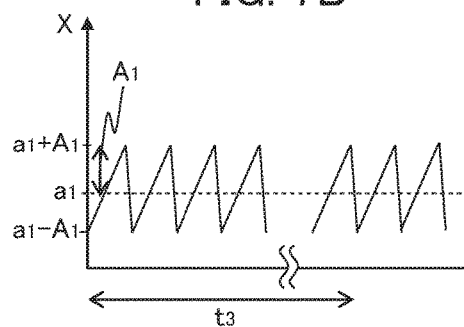
FIG. 7B is a diagram showing a scan waveform in the X direction with respect to the observation region.
Figure 7D:
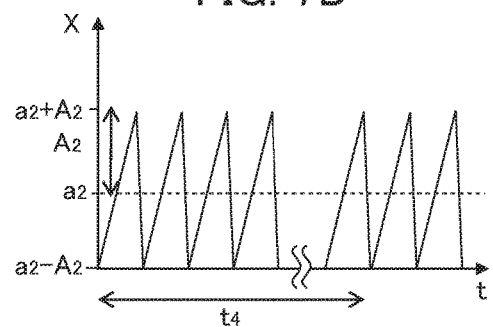
FIG. 7D is a diagram showing a scan waveform in the X direction with respect to the wide region.
Figure 7C:
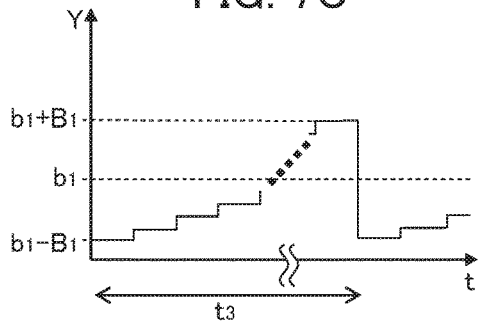
FIG. 7C is a diagram showing a scan waveform in the Y direction with respect to the observation region.
Figure 7E:
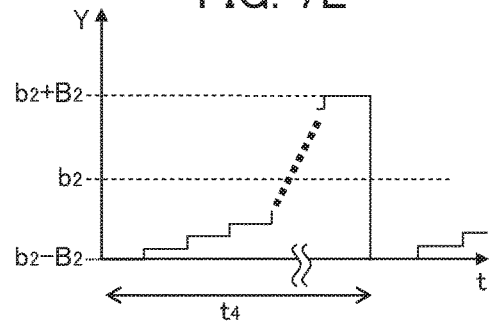
FIG. 7E is a diagram showing a scan waveform in the Y direction with respect to the wide region.

The observation region and the wide region will be described with reference to FIGS. 7A to 7E. FIG. 7A shows the relationship between an observation region 501 and a wide region 502. The wide region 502 is wider than the observation region 501 and includes the observation region 501. An electron beam is scanned in the X direction from the left to the right in the figure. The electron beam returns to an initial position in the X direction, moves to the next line and is scanned again in the X direction. FIG. 7B and FIG. 7C respectively show scanning waveforms in the X direction and in the Y direction when irradiating the observation region 501 with the electron beam. Further, FIG. 7D and FIG. 7E respectively show scanning waveforms in the X direction and in the Y direction when irradiating the wide region 502 with the electron beam. The center of the scanning waveform in the X and Y directions of the observation region 501 is $(a_1, b_1)$. At this time, the amplitude of the scanning waveform in the X direction is $A_1$ and the amplitude of the scanning waveform in the Y direction is $B_1$. Further, the center of the scanning waveform in the X and Y directions of the wide region 502 is $(a_2, b_2)$. At this time, the amplitude of the scanning waveform in the X direction is $A_2$ and the amplitude of the scanning waveform in the Y direction is $B_2$. It is desirable that the center $(a_1, b_1)$ of the scanning waveform in the X and Y directions of the observation region 501 is close to the center $(a_2, b_2)$ of the scanning waveform in the X and Y directions of the wide region 502. This is because it is possible to equally block contamination moving from all directions to the observation region. Further, as shown in FIG. 7B and FIG. 7C, the scan of the observation region 501 is completed with irradiation time $t_3$. One scan of the region is referred to as one frame. When an image of the region is generated, the signal is generally weak with only one scan. For this reason, the image is generated by integrating a plurality of image frames. Similarly, as shown in FIG. 7D and FIG. 7E, the scan of the wide region 502 is completed with irradiation time $t_4$.

The irradiation of the sample with the electron beam is performed by the system control unit 208 (see FIG. 2). In Example 2, the irradiation is repeatedly performed by switching between the irradiation of the observation region and the irradiation of the wide region. The irradiation time for one irradiation of the observation region is $t_1$ and the number of frames obtained during this period is $N_1$. Further, the irradiation time for one irradiation of the wide region is $t_2$ and the number of frames obtained during this period is $N_2$. As described above, the irradiation time, time $t_3$, is required for one frame of the observation region, and the irradiation time, time $t_4$, is required for one frame of the wide region. Thus, the following relationship can be established:

The irradiation time $t_1$ of the observation region=the number of obtained frames $N_1$×the irradiation time $t_3$ per frame The irradiation time $t_2$ of the wide region=the number of obtained frames $N_2$×the irradiation time $t_4$ per frame The irradiation is performed by sequentially switching from one to another. The ratio of the irradiation time $t_1$ of the observation region to the irradiation time $t_2$ of the wide region, $t_1:t_2$, is referred to as the irradiation ratio. The irradiation ratio varies depending on the observation conditions and the sample information. The sample information is any one of the sample material and the sample pattern shape, or a combination of them. Based on the determined irradiation ratio, it is possible to switch between the observation region irradiation and the wide region irradiation by switching scanning signal to be transmitted from the system control unit 208 to the scanning deflection deflector 203.

Figure 8:
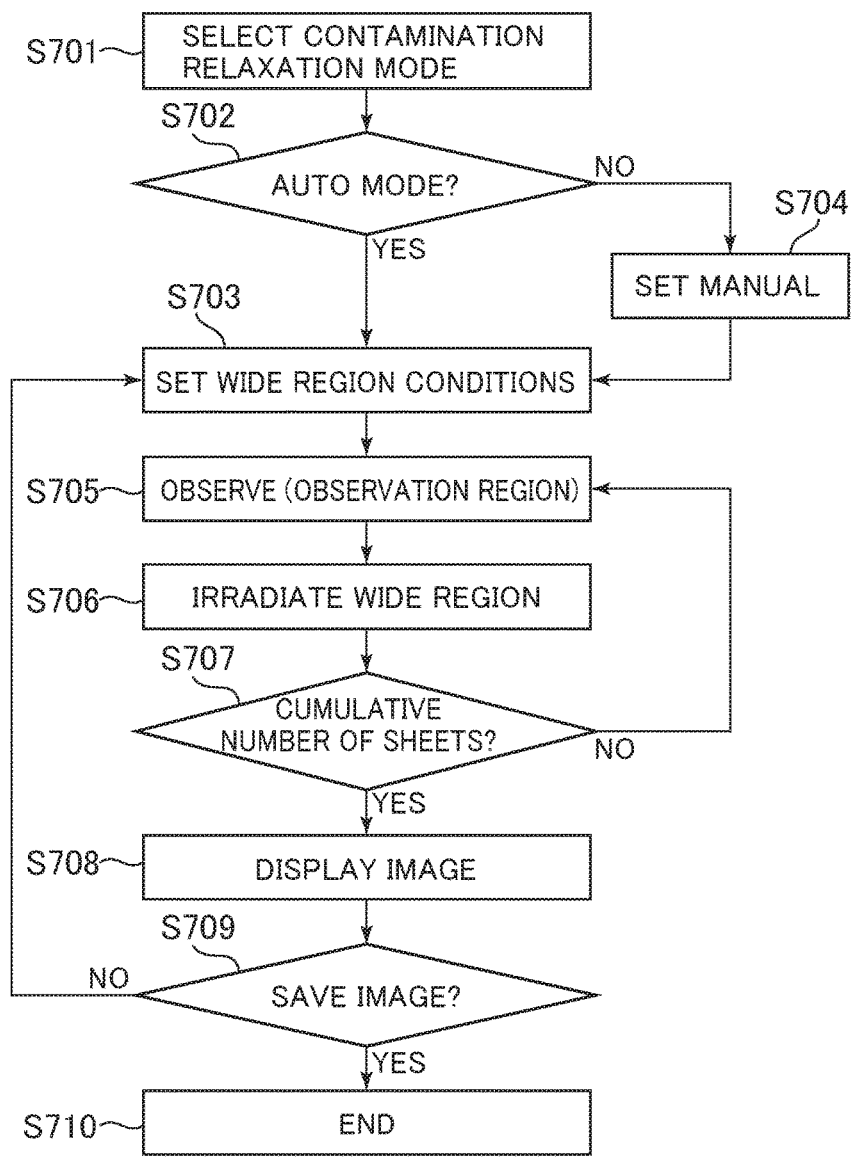
FIG. 8 is a flow chart for obtaining an image in the contamination relaxation mode.
Figure 9:
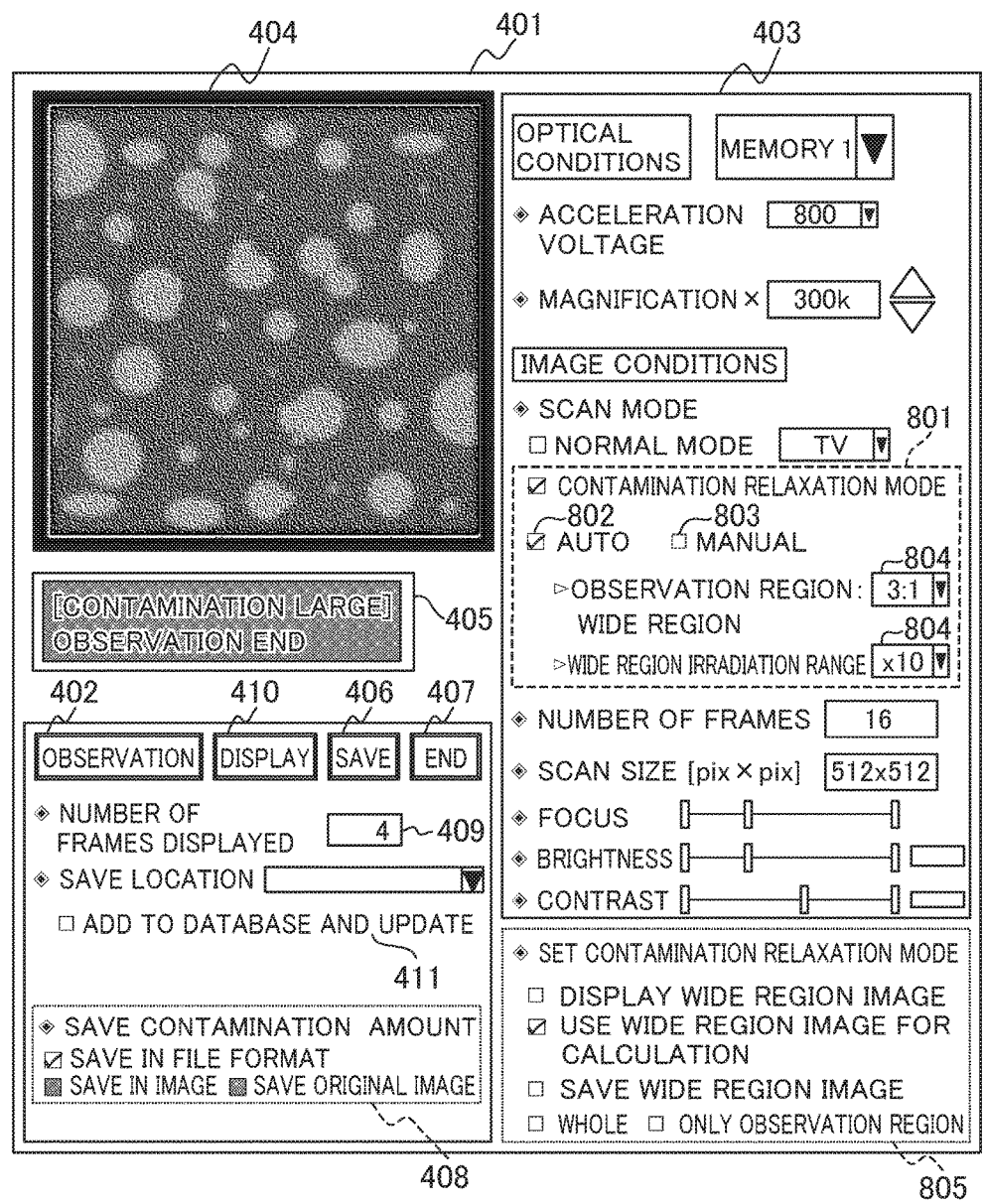
FIG. 9 is a diagram showing the operator control panel.

The procedure in which the operator sets the observation region irradiation and the wide region irradiation to obtain the image will be described with reference to FIGS. 8 and 9. Note that the mode in which the irradiation of the sample with the electron beam is performed by switching between the observation region irradiation and the wide region irradiation is called "contamination relaxation mode". FIG. 8 is a flow chart for obtaining an image in the contamination relaxation mode. FIG. 9 is an example of GUI through which the operator controls the process. Note that the control panel 401 shown in FIG. 9 is the same as FIG. 4, except that a wide region setting section 801 and a contamination relaxation mode setting section 805 are included in the observation condition setting section 403, and thus, similar components will not be described again here.

The operator selects the irradiation method on the control panel 401 shown in FIG. 9. The irradiation method can be selected from either "normal mode", in which only the observation region is irradiated, or "contamination relaxation mode" as the scan mode. When the "normal mode" is selected, the observation process follows the flow chart shown in FIG. 3 (Example 1). In the present example, the "contamination relaxation mode" is selected.

The operator selects the contamination relaxation mode (Step S701). Then, the operator determines whether to perform the wide region setting in automatic mode or in manual mode (Step S702). In the case of the automatic mode, when the operator checks a check box 802 of the automatic mode, the irradiation ratio between the observation region and the wide region as well as the wide region conditions, such as the range of wide region, are automatically determined based on the observation conditions set by the operator (Step S703). Then, the observation is started (Step S705). More specifically, in Step S703 of setting wide region conditions, since the observation conditions as well as the information obtained by associating the sample information with the contamination amount are stored in the observation result database 220 (see FIG. 6), the calculation part 209 of the system control unit 208 calculates the estimated amount of contamination to determine appropriate wide region conditions according to the estimated amount of contamination. When the wide region setting is not performed in the automatic mode, the operator checks a check box 803 of the manual mode. Then, the operator selects the irradiation ratio between the observation region and the wide region as well as the wide region irradiation range from a pull-down 804 of the wide region setting section 801 (Step S704), sets wide region conditions (Step S703), and starts the observation (Step S705). The setting of wide region conditions in manual mode is not limited to the pull-down method, but is also applicable to method in which the operator directly inputs values. Further, it is also possible to set the parameters to be set based on the irradiation times $t_3$, $t_4$ per frame in each of the observation region and the wide region, or based on the number of frames $N_1$, $N_2$ obtained from the respective regions, instead of setting the irradiation ratio as shown in the figure.

The observation of observation region (Step S705) is the same as the flow chart shown in FIG. 3. In the present example, electron beam irradiation is performed by switching between irradiation of the observation region and irradiation of the wide region including the observation region at a predetermined ratio based on the set conditions. The acquisition of the image at this time follows the setting of the contamination relaxation mode that is set in the contamination relaxation mode selection. This setting is performed in the contamination relaxation mode setting section 805 of the control panel 401 (see FIG. 9).

The contamination relaxation mode setting section 805 is to select a process method for save and use of the image generated in the wide region irradiation. It is possible to set the image to be displayed or saved at the time of wide region irradiation, or to selectively display only the observation region of the wide region, or to use the observation region of the wide region to calculate the contamination amount. In accordance with the input setting, it is possible to irradiate at small pixel intervals also in the wide region irradiation so that the number of pixels of the displayed observation region is equal to the number of pixels in the irradiation of the observation region, or it is also possible to irradiate by adjusting the pixel interval so that the number of pixels is equal to the number of pixels of the observation region when irradiating only the observation region part in the wide region with the electron beam, while irradiating other areas at rough pixel intervals.

Figure 10:
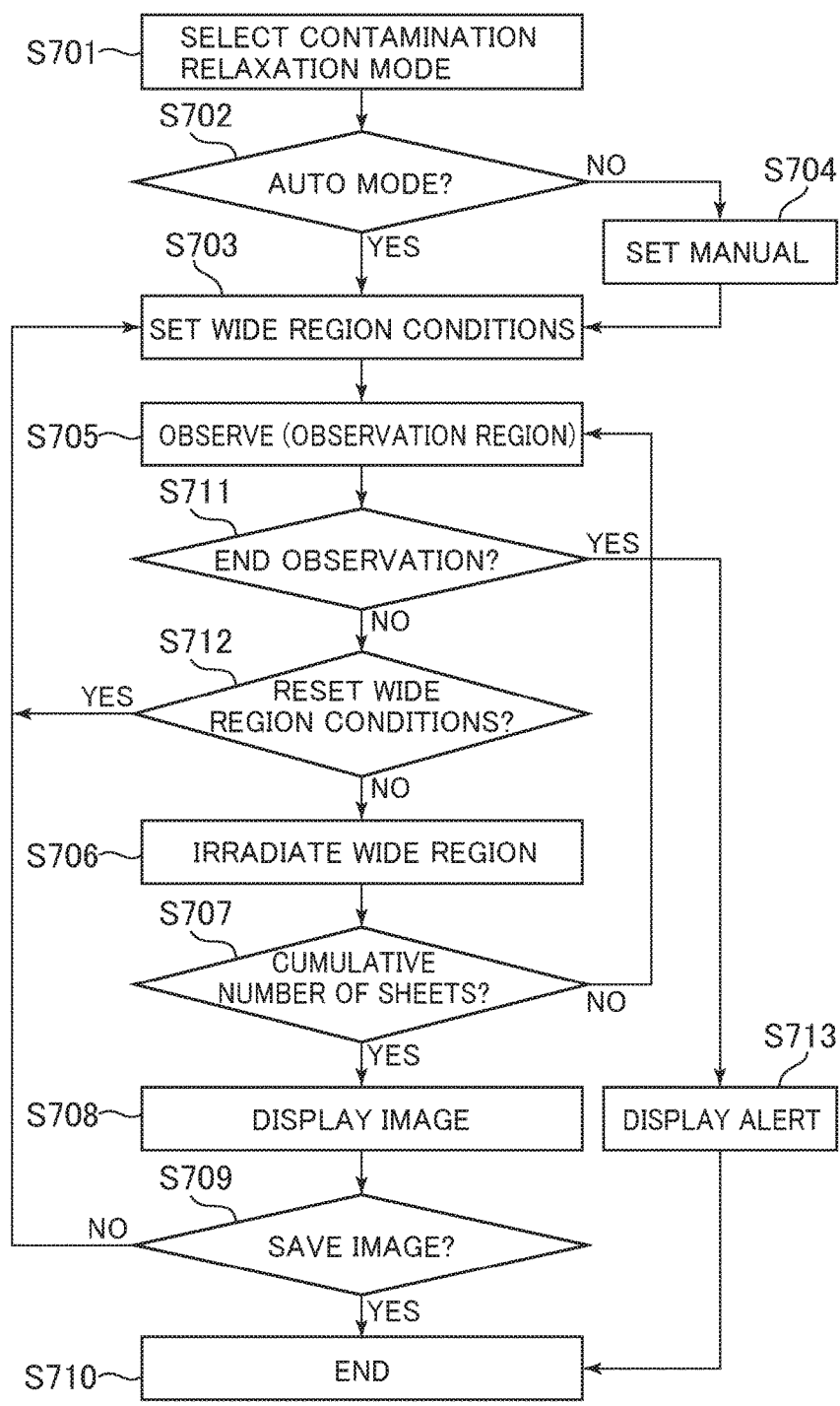
FIG. 10 is a flowchart for obtaining an image in the contamination relaxation mode.

In addition, it is possible to perform observation by feeding back the contamination amount calculated from the feature amount being observed to the system control unit 208 (see FIG. 2), and by automatically changing the wide region conditions such as the irradiation ratio between observation region irradiation with electron beam and wide region irradiation with electron beam. The flow chart of image acquisition in this case is shown in FIG. 10. In this case, it is determined whether or not to reset the wide region conditions from the observed contamination obtained from the feature amount of the image (Step S712). The threshold value for the contamination amount used for this determination is called a wide region condition threshold $C_1$. The wide region condition threshold $C_1$ is set separately from an observation end threshold $C_2$, which is the threshold value for the contamination amount to determine the end of the observation (Step S711, the same as Step S305 in FIG. 3). The relationship between them is as follows: the wide region condition threshold $C_1$<the observation end threshold $C_2$. When the contamination amount during the observation does not exceed the wide region condition threshold, the operator determines that little contamination adheres and repeats the observation. When the contamination amount during the observation exceeds the wide region condition threshold, the operator determines that contamination will adhere to a non-negligible level if the observation is continued. Thus, the operator resets the wide region conditions so that contamination adhesion is more strongly reduced (Step S703), and repeats the observation. Examples of conditions to more strongly reduce contamination adhesion are: further increasing the range of the wide region; and further increasing the wide region irradiation time to increase the ratio of the irradiation time of the wide region to the irradiation period of the observation region.

Furthermore, it may be possible to determine the wide region according to the size of the observation region upon setting of the wide region. In other words, when a small observation region is observed, the amount of electron beam irradiation per unit area is increased and the power of attracting contamination is strong. In such a case, contamination is likely to gather and adhere to the observation region. On the other hand, when a wide observation region is observed, the amount of electron beam irradiation per unit area is reduced and the power of attracting contamination is small. In such a case, contamination is not likely to adhere to the observation region. For this reason, the method in which the irradiation of the observation region and the irradiation of the wide region are switched is effective in a small observation region, but is less effective in a wide observation region.

Figure 11:
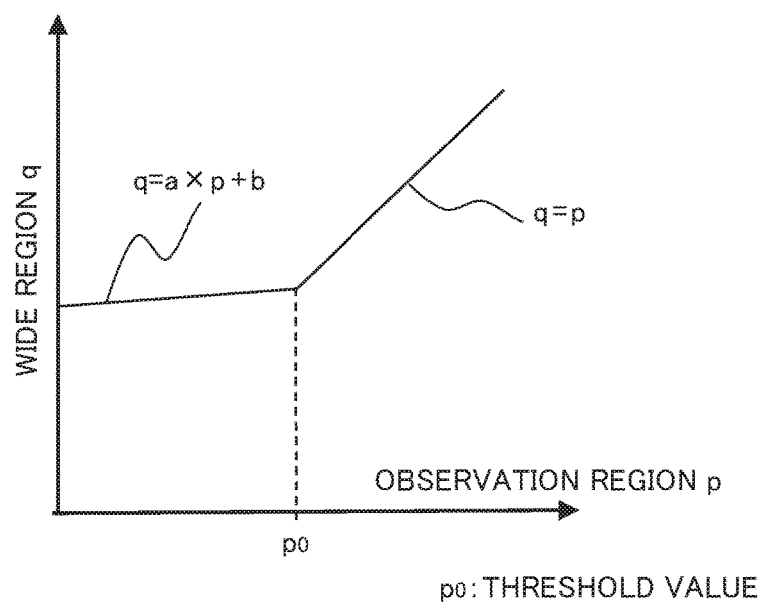
FIG. 11 is an example of setting a wide irradiation region according to the size of the observation region.

FIG. 11 shows an example of setting the size of the wide region according to the size of the observation region. The size of the observation region is p and the size of the wide region is q. Here, p is the generalization of $2A_1$ or $2B_1$, and q is the generalization of $2A_2$ or $2B_2$ (see FIG. 7A). When the observation region is large, the risk that contamination will adhere is low, and so there is no need to switch to the wide region. When the observation region is small, the size of the wide region is linearly increased in accordance with the increase in the observation region, in order to irradiate the wide region that is larger than the observation region with the electron beam.

At this time, the size p of the observation region and the size q of the wide region are set to satisfy the following relationship.

$$q = a \times p + b$$

where $a=1$ when $p \geq p_0$, and $0 \leq a < 1$, $b > 0$ when $p < p_0$.

Here, $p_0$ is the threshold value for the area size for switching between the observation region and the wide region, and is determined in advance before the observation. Note that it is experimentally found that the size of the threshold $p_0$ is 5 μm or less. Further, in the example of FIG. 11, the size p of the observation region and the size q of the wide region are equal when $p=p_0$, and $q=a \times p_0+(0 \leq a < 1, b>0)=p_0$ is established. However, this consistency is not necessarily required. The condition once set to the threshold value for the region size is stored in the storage part, and is automatically called in the observation condition setting.

EXAMPLE 3

Figure 12A:
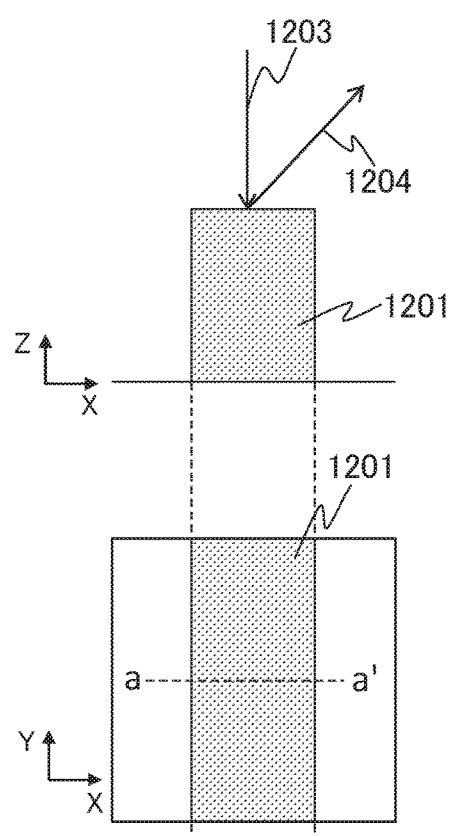
FIG. 12A is a diagram showing the pattern shape and line profile before adhesion of contamination.
Figure 12B:
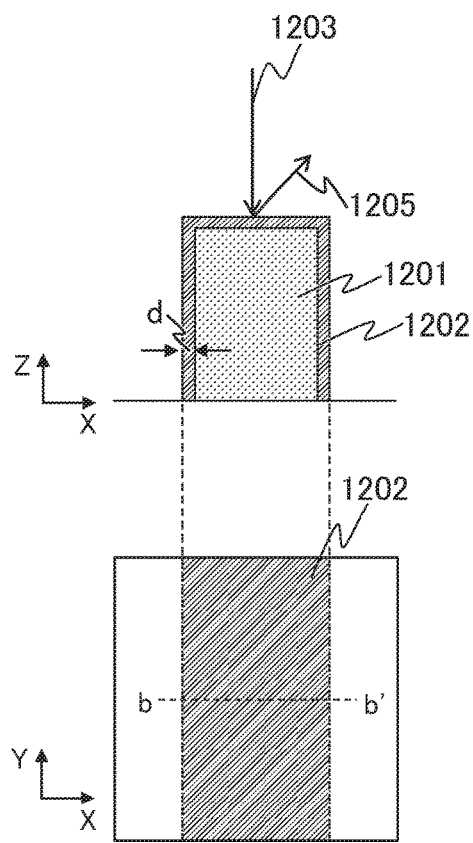
FIG. 12B is a diagram showing the pattern shape and line profile after adhesion of contamination.

The present example restores an image with no adhesion of contamination, from the image with adhesion of contamination based on the calculated contamination amount. When contamination adheres to the sample surface, the feature amount in the image varies. This change occurs because the dimensions of the sample shape increase according to the amount of adhering contamination, and also because the amount of secondary electron emission varies as the material of the sample surface changes to hydrocarbon (contamination). FIGS. 12A and 12B show examples of shape change and change in the amount of secondary electron emission due to adhesion of contamination. FIG. 12A shows a case where contamination does not adhere to the surface of the sample, in which the upper part is a cross-sectional view of the sample, the middle part is a top view of the sample, and the lower part is a line profile of the sample. The profile is taken along line a-a' of the top view. Further, FIG. 12B shows a case where contamination adheres to the surface of the sample, in which the upper part is a cross-sectional view of the sample, the middle part is a top view of the sample, and the lower part is a line profile of the sample. The profile is obtained along line b-b' of the top view.

When a sample, namely, a pattern 1201 is irradiated with an electron beam 1203, a secondary electron 1204 is emitted. At this time, when a contamination 1202 adheres to the surface of the sample with a thickness of d by the electron beam irradiation, the width of the pattern 1201 is increased by d. Further, the amount of emission of a secondary electron 1205 when the contamination adheres to the surface of the sample varies with respect to the amount of emission of the secondary electron 1204 when the contamination does not adhere thereto. This occurs because hydrocarbon, which is the material of the contamination, is different from the material that configures the pattern 1201. In other words, the amount of secondary electron emission, namely, the amount of detected signal varies due to adhesion of the contamination and so the brightness of the image varies. As a result, as shown in the lower parts of FIGS. 12A and 12B, the brightness increases in the line profile after the contamination adhered, as compared to the line profile before adhesion of the contamination. At the same time, the line width becomes thicker than before.

Because the dimension value of the pattern is calculated using the line profile, the calculated dimension value of the pattern varies between before and after adhesion of the contamination. In general, in the case of measuring the width of the line, the point O at which the brightness of the image is 50% of the maximum brightness of the image is selected as a reference point for measurement. For example, the width of the line is measured at point $O_1$ before adhesion of the contamination and at point $O_2$ after adhesion of the contamination. Because of this, the position of the point O also depends on the brightness information, so that not only change in the shape but also change in the brightness will affect the measurement. Thus, it is difficult to accurately measure the pattern dimension value with no adhesion of the contamination.

Figure 13:
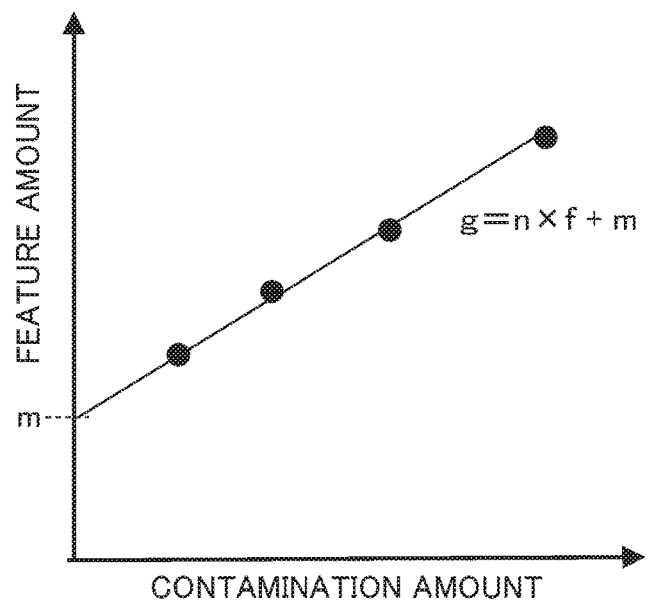
FIG. 13 is a diagram showing the change in the feature amount with the change in the contamination amount in the image with the adhesion of contamination.

As described above, the feature amount of the image varies in accordance with the change in the sample shape as well as the change in the amount of secondary electron emission between before and after adhesion of the contamination. Thus, as described with reference to FIG. 6, if a learning model showing the relationship between a plurality of feature amounts, for example, the sample shape change as well as the change in the amount of secondary electron emission, and the contamination amount at this time is obtained from the observation result database, it is possible to estimate and restore the image before adhesion of contamination from the image after adhesion of contamination. FIG. 13 is a diagram showing the change in the feature amount in accordance with the change in the contamination amount in the image with adhesion of the contamination. Here, the feature amount is the line dimension value obtained from the line profile. Note that the feature amount is not limited to dimension value, and may be the brightness and contrast of the image, or a combination of them.

When the dimension value is measured from the line profile for one line of the obtained image as shown in the lower parts of FIGS. 12A and 12B, the brightness of the image varies depending on the difference in the material and shape, so it is possible to determine that the point at which the brightness rapidly changes between adjacent pixels is a boundary of the material and the shape. Thus, first the device binarizes the whole image by providing a threshold value to extract a point at which adjacent pixels have different values as a boundary. Then, the device draws a vertical line for each boundary to obtain a line profile. Note that boundary acquisition is not limited to using image binarization. It is also possible to obtain the difference or differential value between adjacent two pixel points to determine the point at which the value is equal to or more than the threshold value, as the boundary. Here, in addition to the line width, namely, the dimension value obtained at the point of the 50 percent maximum brightness from the obtained line profile, the device also measures the line width obtained at the point of the maximum brightness as well as the line width that is obtained regardless of the brightness change, namely, at a predetermined fixed point. The measurement of line width can be a value measured from each line profile or can be an integrated value of a plurality of line profiles. With respect to the dimension value, although sensitivity to adhesion of contamination is reduced by changing the measurement reference point O in response to changes in the maximum brightness, the line width measured at the maximum brightness point and the line wide measured at the fixed brightness point significantly change, respectively, due to adhesion of contamination. Thus, it is possible to correct the dimension value obtained at the point of the 50 percent maximum brightness by estimating the time and amount of adhering contamination from the amount of change in the line widths with respect to time change. In this way, it is possible to obtain the dimension value associated with the change due to contamination adhesion. By increasing the number and type of features used, it is possible to estimate the change in the whole image and restore the image before contamination adhesion.

As shown in FIG. 13, the feature amount, namely, the dimension value increases as the contamination amount increases. It is possible to obtain the equation $g=n \times f+m$ that shows the relationship between the contamination amount f and the feature amount g by obtaining a plurality of experimental values while increasing the amount of contamination to plot the increase in the feature value, and by drawing an approximate line. The feature amount intercept m means f=0, namely, the feature amount when contamination does not adhere. In other words, the feature amount with no contamination can be calculated by obtaining the feature amount intercept m. The relational expression obtained as described above is stored to the learning model database 221.

Note that the relationship of the feature amount to the contamination amount is not necessarily expressed by a first-order linear function. Further, as the feature amount for obtaining the relationship to the contamination amount, it may also be possible to obtain a similar approximation by setting a plurality of points and a plurality of types. In addition, it may be possible to generate a model based not only on the experimental result but also on the result obtained by a simulation.

Figure 14:
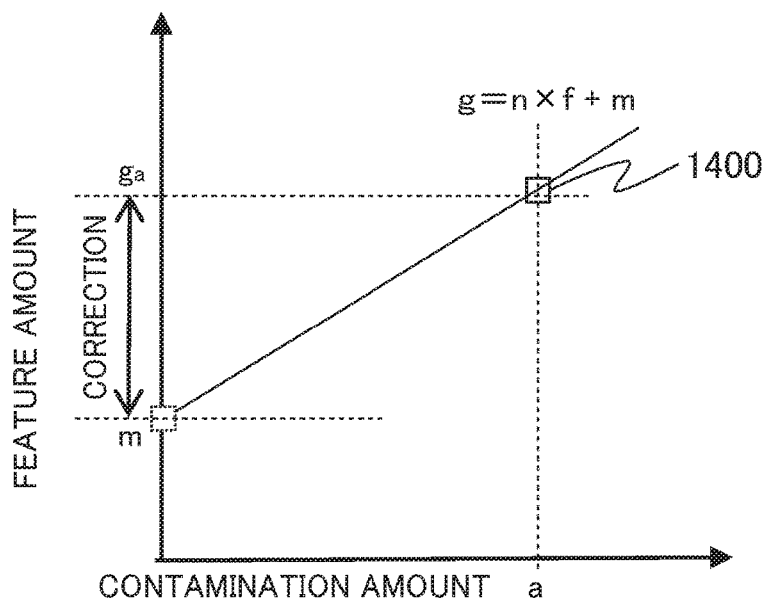
FIG. 14 is a diagram showing a method for restoring the image before adhesion of contamination.

Next, a description will be given of the method of restoring the image before contamination adhesion based on the previously generated database. FIG. 14 is a plot of the values of the contamination amount a, which are obtained by observation, on a graph of relational expression between contamination amount and feature amount obtained as described above. For the relational expression between contamination amount and feature amount, the device refers to the relational expression between contamination amount and feature amount corresponding to the sample information being observed and the observation conditions. The feature amount $g_a$ of the contamination amount a in the current observation is given by the relational expression as $g_a=n \times a+m$, which can be considered as the value appearing in the obtained image in which the feature amount was obtained.

On the other hand, since the feature amount intercept m is the feature amount with no contamination, the correction amount of the image can be obtained as $g_a - m$. It is possible to restore the image with no adhesion of contamination by subtracting the correction value from the obtained image.

Note that the image with no adhesion of contamination can be restored by using the relational expression (model) between contamination amount and feature amount corresponding to the sample information being observed as well as the observation conditions. However, there may be a situation where data corresponding to the current observation conditions is not present in the learning model database. In such a case, it may be possible to estimate the relational expression applied to the current observation conditions by referring to the observation results in which some of the conditions are identical. For example, with respect to the probe current condition which is one of the observation conditions, it is assumed that the identical one to the current observation is not present in the database and a plurality observation results with different probe current values are present. At this time, it is possible to estimate the relational expression between the contamination amount and the feature amount in the current observation conditions by deriving the relational expression between probe currents and coefficients, such as sloops and intercept, in the relational expression between the contamination amount and the feature amount for each of the probe currents within the database.

Further, it may also be possible to update the relational expression between the contamination amount and the feature amount by adding the results obtained by the current observation to the database as new data points. The operator can update the information by adding the current image and the calculation results into the database, for example, by pressing the save button 406 in FIG. 4 (FIG. 9) and checking the add and update check box 411.

LIST OF REFERENCE SIGNS

201 . . . electron source, 202 . . . electron beam, 203 . . . scanning deflection deflector, 204 . . . objective lens, 205 . . . detector, 206 . . . stage, 207 . . . sample, 208 . . . system control unit, 209 . . . calculation part, 210 . . . storage part, 211 . . . measurement part, 212 . . . input/output device, 213 . . . secondary electron, 401 . . . control panel, 402 . . . observation button, 403 . . . observation condition setting section, 404 . . . output window, 405 . . . alert display section, 406 . . . save button, 407 . . . observation end button, 408 . . . contamination information adding method selection section, 409 . . . input section, 410 . . . image display button, 411 . . . add and update check box, 501 . . . observation region, 502 . . . wide region, 801 . . . wide region setting section, 802 . . . auto mode check box, 803 . . . manual mode check box, 805 . . . contamination relaxation mode setting section

The invention claimed is:

1. A charged particle beam device comprising:
a deflector for scanning a charged particle beam;
a detector for detecting secondary charged particles generated by the interaction of the charged particle beam with a sample; and
a system control unit including a calculation part, a measurement part, and a storage part,
wherein the measurement part measures a feature amount from an image formed based on a signal output from the detector after a charged particle beam is scanned on the sample by the deflector,
wherein the calculation part calculates an amount of contamination adhering to a surface of the sample by irradiation of the sample with the charge particle beam, from a change in the feature amount measured by the measurement part, and
wherein the storage part adds the information of the contamination amount to the image and stores the image information.

2. The charged particle beam device according to claim 1, wherein the storage part stores the image together with a text file in which information of the contamination amount is described.

3. The charged particle beam device according to claim 1, wherein, in the calculation part, when the contamination amount calculated by the calculation part is equal to or more than a first threshold value, the device displays an alert indicating the end of the irradiation of the sample with the charged particle beam.

4. The charged particle beam device according to claim 3, wherein an observation region for forming the image as well as a wide region including the observation region are set on the sample, and
wherein the deflector is controlled to switch between a scan period for the observation region and a scan period for the wide region at a predetermined ratio.

5. The charged particle beam device according to claim 4, wherein, in the calculation part, when the contamination amount calculated by the calculation part is equal to or more than a second threshold value, the ratio of the scan period for the wide region to the scan period for the observation region is increased, or an area of the wide region is increased.

6. The charged particle beam device according to claim 5, wherein the first threshold value is greater than the second threshold value.

7. The charged particle beam device according to claim 4, wherein when a size of the observation region is greater than a predetermined threshold value, the wide region is set to the same as the size of the observation region, and
wherein when the size of the observation region is smaller than the predetermined threshold value, the size of the wide region is set greater than the size of the observation region.

8. The charged particle beam device according to claim 1, wherein the storage part stores an observation result database and a learning model database,
wherein the observation result database accumulates a past observation result, as well as the observation conditions and sample information under which the past observation result was obtained,
wherein the learning model database accumulates a learning model showing the relationship between the change in the feature amount and the contamination amount under given observation conditions and sample information, which is generated based on a past observation result accumulated in the observation result database as a teacher model, and
wherein the calculation part calls the learning model corresponding to the current observation conditions and sample information, and calculates the contamination amount from the change in the feature amount measured by the measurement part.

9. The charged particle beam device according to claim 8, wherein the calculation part restores the image before adhesion of contamination by correcting the image based on the relationship between the change in the feature amount and the contamination amount in the learning model.

10. The charged particle beam device according to claim 1, wherein the feature amount is any one of image brightness, contrast, and sample shape pattern, or a combination of them.

11. The charged particle beam device according to claim 10, wherein the calculation part calculates the amount of contamination adhering to the surface of the sample by irradiation of the sample with the charged particle beam, from the change in the feature amount measured by the measurement part.

* * * * *